US009897672B2

(12) United States Patent
Smits et al.

(10) Patent No.: US 9,897,672 B2
(45) Date of Patent: Feb. 20, 2018

(54) MRI GRADIENT POWER SYSTEM WITH ADD ON ENERGY BUFFER

(71) Applicant: KONINKLIJKE PHILIPS N.V., Eindhoven (NL)

(72) Inventors: Engenio Johannes Franciscus Maria Smits, Eindhoven (NL); Martin Alexander Hollander, Eindhoven (NL); Johannes Paulus Schoonderbeek, Eindhoven (NL)

(73) Assignee: KONINKLIJKE PHILIPS ELECTRONICS N.V. (NL)

( * ) Notice: Subject to any disclaimer, the term of this patent is extended or adjusted under 35 U.S.C. 154(b) by 791 days.

(21) Appl. No.: 14/394,643

(22) PCT Filed: Apr. 4, 2013

(86) PCT No.: PCT/IB2013/052695
§ 371 (c)(1),
(2) Date: Oct. 15, 2014

(87) PCT Pub. No.: WO2013/156889
PCT Pub. Date: Oct. 24, 2013

(65) Prior Publication Data
US 2015/0054509 A1    Feb. 26, 2015

Related U.S. Application Data

(60) Provisional application No. 61/624,481, filed on Apr. 16, 2012.

(51) Int. Cl.
*G01R 33/385* (2006.01)
*G01R 33/54* (2006.01)

(52) U.S. Cl.
CPC ....... *G01R 33/3852* (2013.01); *G01R 33/543* (2013.01)

(58) Field of Classification Search
CPC .................................................. G01R 33/3852
See application file for complete search history.

(56) References Cited

U.S. PATENT DOCUMENTS 5,063,349 A    11/1991 Roemer
5,270,657 A    12/1993 Wirth
(Continued)

FOREIGN PATENT DOCUMENTS

EP         2839306 B1 *  11/2016  ......... G01R 33/3852
JP       2009240526 A     10/2009
JP         5976920 B2 *   8/2016  ......... G01R 33/3852

OTHER PUBLICATIONS

EPO translation for JP2009240526, Oct. 1, 2017.*
EPO translation for JP5976920, Oct. 1, 2017.*

*Primary Examiner* — Fritz M Fleming

(57) ABSTRACT

The present invention relates to a power supply system (311) for supplying current to a gradient coil (303) of a magnetic resonance imaging system (100), the power supply system (311) comprising: an electrical power supply (309) to supply a first voltage to a gradient amplifier (307) for driving the gradient coil, the gradient amplifier output being connected to the gradient coil (303); an energy buffer having an input connected to the electrical power supply (309), the energy buffer being configured to supply second voltage to the gradient amplifier (307), the energy buffer being in parallel to the gradient amplifier (307) and the electrical power supply (309), the energy buffer comprising a voltage converter (313) configured to control the second voltage as to compensate for a variation in the first voltage resulting from the driving of the gradient coil (303).

10 Claims, 5 Drawing Sheets

(56) References Cited

U.S. PATENT DOCUMENTS

| | | | |
|---|---|---|---|
| 5,617,030 A | 4/1997 | Fischer | |
| 5,701,076 A * | 12/1997 | Schmitt | G01R 33/3852 324/322 |
| 6,034,565 A * | 3/2000 | Schweighofer | G01R 33/3852 330/10 |
| 6,552,448 B1 | 4/2003 | Gegner | |
| 7,253,625 B2 | 8/2007 | Trabbic et al. | |
| 7,397,248 B2 | 7/2008 | Lenz | |
| 2013/0278267 A1* | 10/2013 | Hori | G01R 33/28 324/322 |
| 2017/0176555 A1* | 6/2017 | Kawajiri | G01R 33/3852 |

* cited by examiner

MRI GRADIENT POWER SYSTEM WITH ADD ON ENERGY BUFFER

CROSS-REFERENCE TO PRIOR APPLICATIONS

This application is the U.S. National Phase application under 35 U.S.C. § 371 of International Application No. PCT/IB2013/052695, filed on Apr. 4, 2013, which claims the benefit of U.S. Provisional Patent Application No. 61/624,481, filed on Apr. 16, 2012. These applications are hereby incorporated by reference herein.

TECHNICAL FIELD

The invention relates to magnetic resonance imaging, in particular to power supplies for the magnetic field gradient coils of magnetic resonance imaging systems.

BACKGROUND AND RELATED ART

In Magnetic Resonance Imaging (MRI), gradient amplifiers are typically used to provide current for magnetic field gradient coils to provide spatial encoding of atomic spins located in a magnetic field. These gradient amplifiers are typically characterized by high peak power and high precision of the generated current waveforms.

However, during the measurement of magnetic resonance signals obtained from a subject to be imaged, the field gradients must be maintained steady. Otherwise, signals of different locations of the subject cannot be distinguished and the resulting image may be distorted.

U.S. Pat. No. 6,552,448 discloses an energy management controller for use with series connected amplifier modules which monitors the rail voltage across an energy storage capacitor.

SUMMARY OF THE INVENTION

It is an objective of embodiments of the invention to provide for a method for supplying current to a gradient coil, a power supply system, a gradient amplifier and a computer-program product. Said objective is solved by the subject matter of the independent claims. Advantageous embodiments are described in the dependent claims.

Magnetic Resonance Imaging (MRI) data is defined herein as being the recorded measurements of radio frequency signals emitted by atomic spins and acquired by the antenna of a magnetic resonance imaging apparatus during a magnetic resonance imaging scan. A magnetic resonance image is defined herein as being the reconstructed two or three dimensional visualization of magnetic resonance imaging data. This visualization can be performed using a computer.

In one aspect, the invention relates to a power supply system for supplying current to a gradient coil of a magnetic resonance imaging system, the power supply system comprising an electrical power supply to supply a first voltage to a gradient amplifier for driving the gradient coil, the gradient amplifier output being connected to the gradient coil; an energy buffer having an input connected to the electrical power supply, the energy buffer being configured to supply a second voltage to the gradient amplifier, the energy buffer being in parallel to the gradient amplifier and the electrical power supply, the energy buffer comprising a voltage converter configured to control the second voltage as to compensate for a variation in the first voltage resulting from the driving of the gradient coil.

In a prior art MRI apparatus, a power chain may be employed to provide a current to the gradient coil. The power chain comprises the power supply and the gradient amplifier which transforms its input signal with the use of the power supply to a level of a first voltage sufficient to drive the gradient coils. The current source is usually provided with energy conserving means (i.e. energy buffers). The energy conserving means comprise at least one capacitor to supply power to the gradient amplifier during waveforms for which the power dissipation in the gradient coil resistances exceeds the power ranges of the power supply. The current of the gradient coil then passes through the capacitor and the energy of the capacitor is added to the energy of the power supply. However, only a fraction of the stored energy in this capacitor is utilized because the gradient amplifier has a lower acceptable limit on the input voltage. The diminution of the input voltage to the gradient amplifier may be due to a dissipation of energy in the gradient coil. To overcome this issue, the present invention uses a voltage converter to decouple such capacitor from the gradient amplifier. That is, the voltage converter transforms a second voltage of the energy buffer so that the second voltage is supplied to the gradient amplifier and the sum of the energies of the capacitor and the power supply may be used to generate a desired magnetic gradient field in the gradient coil. Notably, the energy buffer with the voltage converter can be configured to fully compensate, within a preset tolerance range, variations in the first voltage. This avoids errors in the gradient encoding and thus avoids geometric distortions in the reconstructed magnetic resonance image. Alternatively, a partial compensation of the variations in the first voltage achieves that the electrical power supply that supplies the first voltage may satisfy less strict stability requirements. As less strict stability requirements of the electrical power supply are acceptable because to some degree variations are compensated for by the energy buffer and voltage converter, a less expensive electrical power can be employed.

An example of the voltage converter may be a DC-to-DC converter with controlled charge and discharge current.

According to one embodiment, the energy buffer further comprises a capacitor connected at an input of the voltage converter.

The capacitor works as an energy accumulator. It is able to store a large amount of energy, in the order of 1 to 3 kJ and to supply currents for a period of time up to around 100 ms.

According to one embodiment, the power supply system further comprises a supply capacitor connected in parallel circuit with the energy buffer and the gradient amplifier, the supply capacitor being configured to supply a peak power to the gradient coil.

In case a load such as the gradient coil requires a start-up current which is much higher than the power supply current, the supply capacitor may be used avoiding sizing the power supply itself to fulfill the requirement. Typically, the supply capacitor supplies an amount of energy in the order of 100-200 J and uses a short time period, in the order of 300 μs, to supply the current to the gradient coil.

According to one embodiment, the variation in the first voltage is due to a voltage drop across the gradient coil which exceeds a maximum deliverable power of the electrical power supply. For example, during imaging scans, where the total dissipated power in the gradient coil is higher than the maximum power that the power supply may supply, the nominal voltage to the gradient coil cannot be reached. Thus, the power supply reaches its maximum output voltage.

According to one embodiment, the power supply system further comprises a control unit for detecting the variation in the first voltage and providing feedback for controlling the second voltage to the energy buffer based on the detected variation.

According to one embodiment, the energy buffer is an add-on module to the electrical power supply and/or the gradient amplifier. As an add-on it can be placed as a separate module within a gradient amplifier cabinet and/or in a housing of the power supply.

In another aspect, the invention relates to a gradient amplifier for supplying current to a gradient coil of a magnetic resonance imaging system, the gradient amplifier comprising:

an energy buffer having an input connected to an electrical power supply, the electrical power supply supplying a first voltage to the gradient amplifier for driving the gradient coil, the gradient amplifier being connected in parallel to the gradient coil, the energy buffer being configured to supply a second voltage to the gradient amplifier, the energy buffer being in parallel to the gradient amplifier and the electrical power supply, the energy buffer comprising a voltage converter configured to control the second voltage as to compensate for a variation in the first voltage resulting from the driving of the gradient coil.

In another aspect, the invention relates to a magnetic resonance imaging system comprising a gradient amplifier as described above and an electrical power supply.

In another aspect, the invention relates to a method for supplying current to a gradient coil of a magnetic resonance imaging system by a gradient amplifier system, the method comprising:

supplying, by an electrical power supply, a first voltage to a gradient amplifier for driving the gradient coil, wherein the gradient amplifier is connected in parallel to the gradient coil supplying a second voltage to the gradient amplifier by an energy buffer, wherein the second voltage is controlled by a voltage converter comprised in the energy buffer as to compensate for a variation in the first voltage across the gradient coil resulting from the driving of the gradient coil, wherein the energy buffer has an input connected to the electrical power supply and is in parallel to the gradient amplifier and the electrical power supply.

In another aspect, the invention relates to a computer program product comprising computer executable instructions to perform the method steps of the method of any one of the preceding embodiments.

BRIEF DESCRIPTION OF THE DRAWINGS

In the following, preferred embodiments of the invention will be described in greater detail by way of example only making reference to the drawings in which.

DETAILED DESCRIPTION OF THE EMBODIMENTS

In the following, like numbered elements in these figures are either similar elements or perform an equivalent function. Elements which have been discussed previously will not necessarily be discussed in later figures if the function is equivalent.

Figure 1:
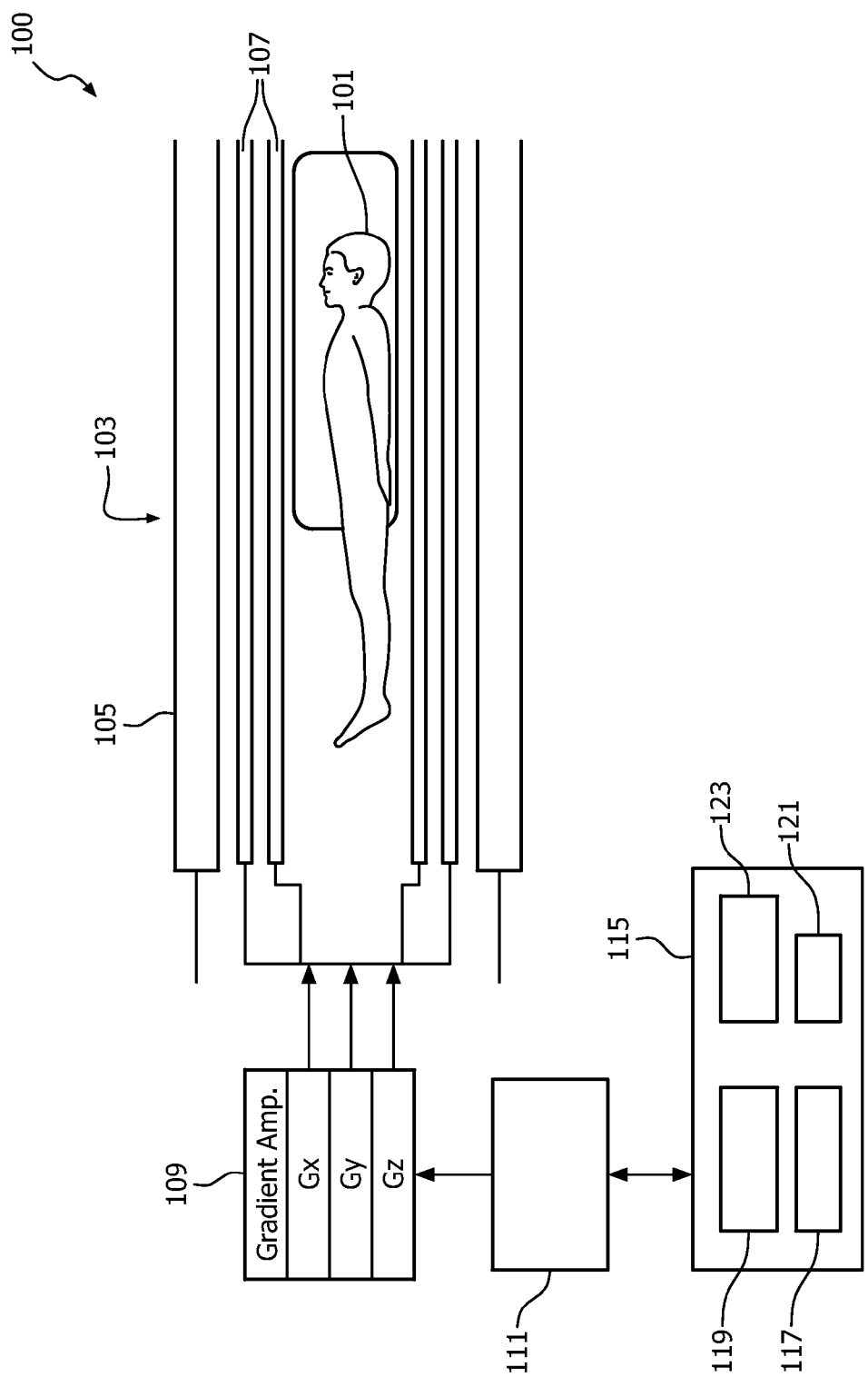
FIG. 1 illustrates a magnetic resonance imaging system.

FIG. 1 illustrates an exemplary magnetic resonance imaging (MRI) system 100 for generating images of a patient 101. MRI system 100 comprises magnetic assembly 103 to generate magnetic fields that will be applied to patient 101. Magnetic assembly 103 comprises magnet coils 105 adapted to produce a static magnetic field required to perform magnetic resonance imaging and gradient coils 107. The gradient coils 107 are made up of an X-axis gradient coil, Y-axis gradient coil, and Z-axis gradient coil. This enables to image different regions of the patient 101.

MRI system 100 further comprises a gradient amplifier unit 109, and a system controller 111. The gradient amplifier unit 109 includes an X-axis gradient amplifier Gx, Y-axis gradient amplifier Gy, and Z-axis gradient amplifier Gz. The gradient coil 107 is connected with the gradient amplifier 109. The X-axis gradient coil, Y-axis gradient coil, and Z-axis gradient coil of the gradient coil 107 are connected, respectively, with the Gx amplifier, Gy amplifier and Gz amplifier of the gradient amplifier 109.

A gradient magnetic field in an X-axis direction, gradient magnetic field in a Y-axis direction, and gradient magnetic field in a Z-axis direction are formed, respectively, by electric currents supplied to the X-axis gradient coil, Y-axis gradient coil, and Z-axis gradient coil, respectively, from the Gx amplifier, Gy amplifier and Gz amplifier of the gradient amplifier. Controller 111 is connected with the gradient amplifier 109.

Controller 111 generates control signals for controlling the gradient amplifier. In particular, controller 111 may generate control signals that induce gradient amplifier unit 109 to energize gradient coils 107. The controller 111 is connected to a computer 115. The computer 115 comprises an input device 117 such as a keyboard, a display device 119, a processor 121, and a storage device 123.

The processor 121 executes programs stored in the storage device 123 of the computer 115. The computer 115 is configured to receive MRI data of imaged regions from the controller 111 and to display imaging regions on the display device 119. The imaging region location is based on selection information from the input device 117.

Figure 2:
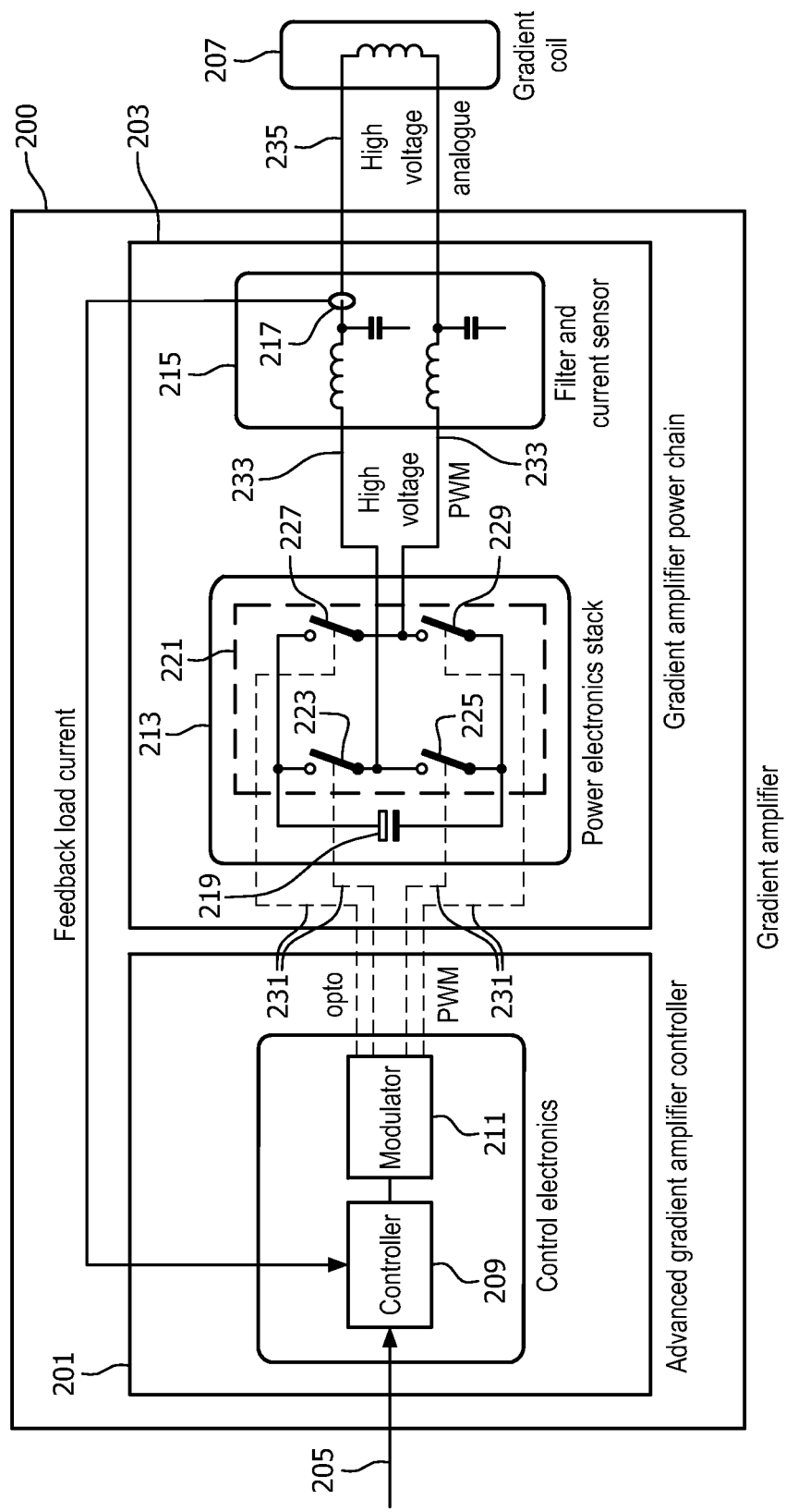
FIG. 2 shows a schematic diagram for a gradient amplifier.

FIG. 2 shows a simplified architecture of a gradient amplifier 200 such as the gradient amplifier 109. Gradient amplifier 200 comprises an advanced gradient amplifier controller 201 and a gradient amplifier power chain 203. The advanced gradient amplifier controller 201 generates control signals for the power chain 203 in such a way that a setpoint 205 received digitally from a source such as a data acquisition system controller is accurately reproduced at the output of the power chain 203. The power chain 203 converts the main power to high voltage and high current that drive the gradient coil 207.

The controller 201 comprises a controller 209 and a modulator 211. The digital controller 209 continuously dictates to the modulator 211 the required modulation setpoint in terms of output voltage based on the setpoint 205, actual and past measured output current and boundary conditions like voltages, damping the output filter, etc.

The modulator 211 converts the modulation setpoint from the controller 209 into suitable Pulse Width Modulation (PWM) signals for all individual gate driver units of the power chain 203. These PWM signals are optimized for high voltage bandwidth and high ripple frequency under the condition that the first voltage is within defined limits.

The power chain 203 consists of a number of blocks that convert the main power to suitable high voltage and high current that drive the gradient coil 207. The power supply (not shown) providing the main power is an AC/DC converter. The main power is further filtered, rectified and stabilized to a nominal voltage. The power chain 203 comprises a power electronic stack 213, a filter 215 and a current sensor 217. The power electronic stack 213 comprises a capacitor 219 which is connected in parallel with a bridge 221 switching power stage. The bridge 221 may be for example a metal-oxide-semiconductor field-effect transistor (MOSFET) or an insulated gate bipolar transistor (IGBT) bridge. Switches 223 and 225 constitute a first half-bridge, 227 and 229 the second half-bridge. The half-bridges are separately driven by pulse width modulators of the control unit 201.

A 'bridge' as used herein encompasses an electric circuit with a voltage supply and four switching elements which are used to connect the voltage supply with the outputs of the bridge circuit. The switching elements allow the polarity of the voltage output by the bridge circuit to be switched.

The control unit 201 is connected with the four switches 223, 225, 227 and 229 via four respective lines 231. The power stack 213 generates a precise and controlled output stage voltage 233 from the main voltage by pulse-width modulation. A residual ripple is filtered out by the filter 215, and the filtered voltage 235 is across the gradient coil 207 as an output voltage. The filter may be for example a low pass filter.

The sensor 217 may produce a feedback signal to the controller 209 indicative of the magnetic gradient field produced for the gradient coil.

Figure 3:
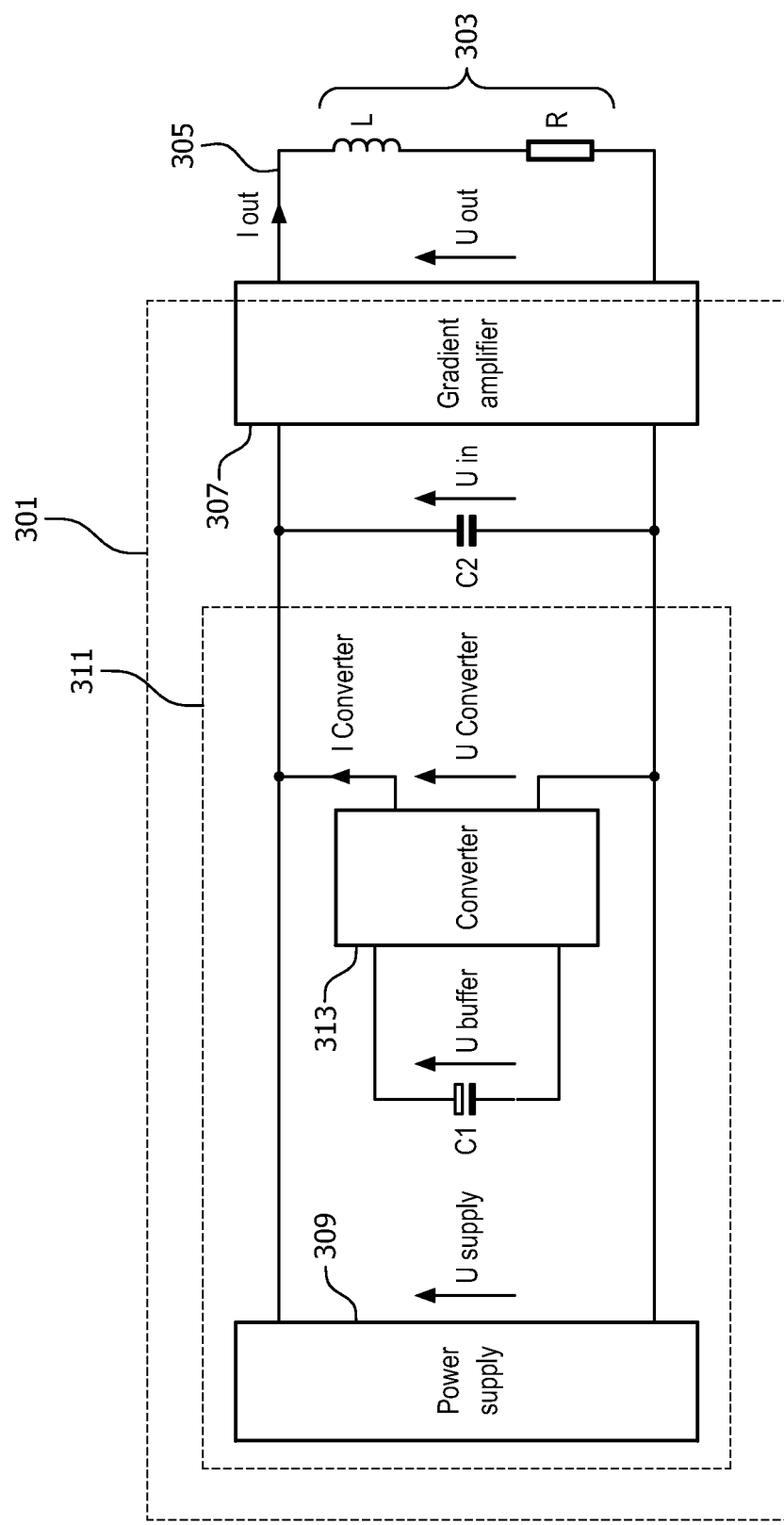
FIG. 3 shows a schematic diagram of a gradient power supply with add-on energy buffer.

For a magnetic resonance imaging system, typically there will be one gradient power supply such the one described in FIG. 3 for each of the three different orthogonal directions.

FIG. 3 shows a simplified schematic diagram of a power chain such as the gradient amplifier power chain 203 for supplying a gradient coil 303. The power chain 301 is shown as having two outputs or connections 305 to the gradient coil 303. The power chain 301 comprises a power supply system 311, a gradient amplifier 307 and a supply capacitor C2 connected in parallel circuit. The supply capacitor C2 is configured to deliver peak power to the gradient coil 303. This is typically performed in a short time period of the order of 300 us. During that time period, an energy exchange between the energy stored in the supply capacitor ($0.5*C2*U_{in}^2$) and the stored energy in the gradient coil L ($0.5*L*I_{out}^2$) may happen. The energy involved is relatively small, in the order of 100-200 J.

The power supply system 311 comprises a power supply 309 and capacitor C1. The power supply 309 is adapted to supply a first voltage $U_{supply}$ to the gradient amplifier 307 for driving the gradient coil 303. The gradient amplifier output is connected to the gradient coil. Capacitor C1 is connected to the power supply 309 via the voltage converter 313 and it is configured to supply a second voltage $U_{buffer}$ to the gradient amplifier 307. In this way, more power than available from the power supply 309 can be delivered to the gradient amplifier for a limited time period.

The voltage converter 313 is configured to control the second voltage $U_{buffer}$ as to compensate for a variation in the first voltage resulting from the driving of the gradient coil, for example, during waveforms where the power dissipation in the gradient coil 303 exceeds the power range of the power supply 309. In the example of FIG. 3, the voltage converter 313 transforms the input voltage $U_{buffer}$ to the output voltage $U_{converter}$ while controlling the current $I_{converter}$. In this way, the voltage $U_{buffer}$ across capacitor C1 is made independent of the voltage $U_{in}$ at the gradient amplifier 307 by the voltage converter 313.

Capacitor C1 stores a substantial large amount of energy, in the order of 1 to 3 kJ. Its discharge time is much longer (up to 100 ms) than the discharge time of capacitor C2. The voltage converter 313 may be for example a DC-to-DC converter with controlled charge and discharge current. Depending on the required operating range of Uin (first voltage) and the voltage across capacitor C1 (second voltage), a buck-boost converter or a boost converter could be used as converter topologies, but other known topologies could be used as well. The advantage of using the voltage converter 313 will be further elaborated in detail with reference to FIG. 4.

Figure 4:
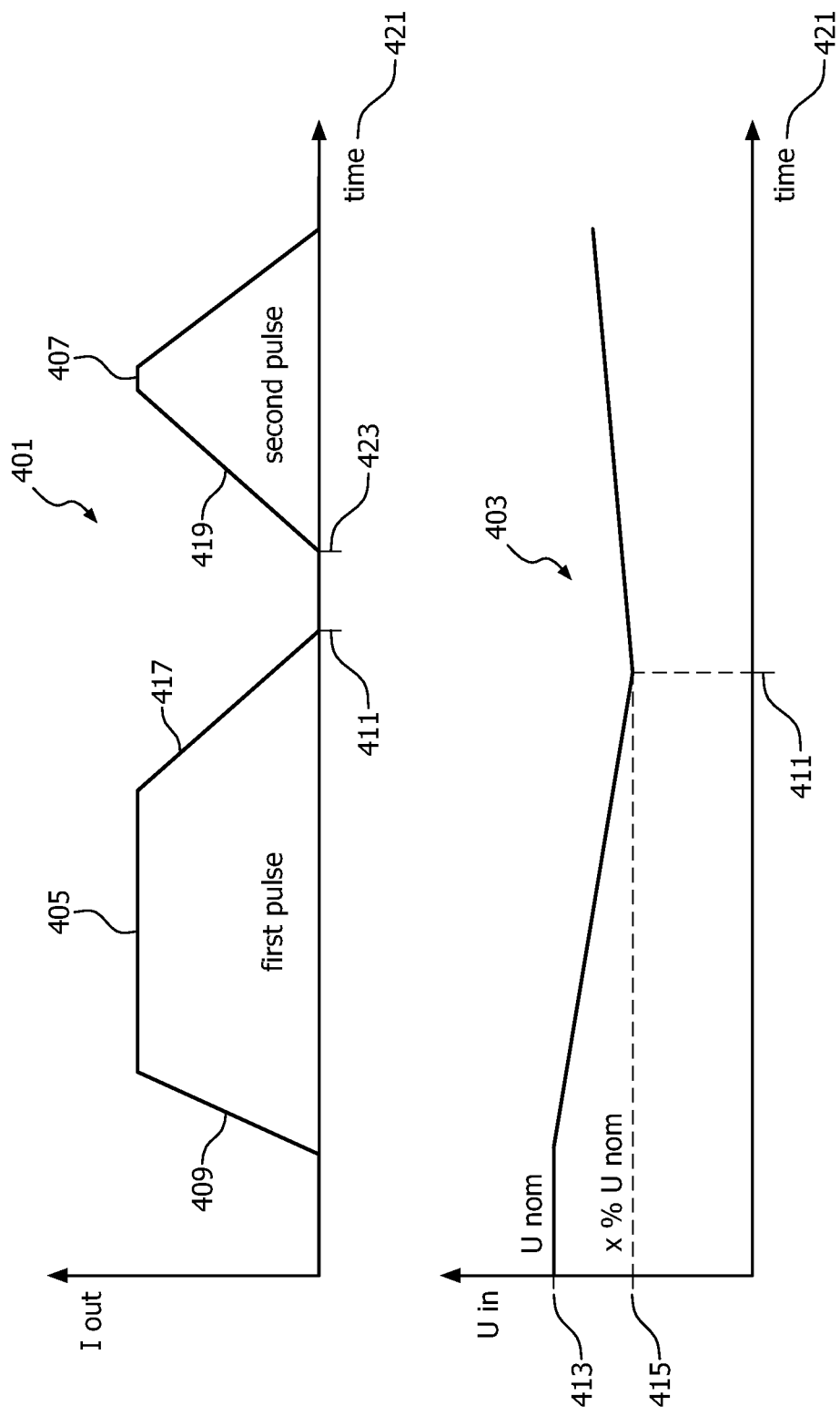
FIG. 4 shows waveforms for a gradient current and the first voltage.

FIG. 4 shows the waveforms for the gradient current $I_{out}$ 401 and the first voltage $U_{in}$ 403 as function of time 421 for prior art systems without the voltage converter 313. Two subsequent gradient current pulses 405 and 407 are generated. The first one 405 has a high amplitude and high rising slope 409. Further, the total power dissipation in the gradient coil 303 is higher than the available power from the power supply 309. As a result, the voltage $U_{in}$ drops while capacitors C1+C2 deliver energy to the gradient amplifier 307. At the end 411 of the first gradient pulse 405, the voltage $U_{in}$ is dropped to x% $U_{nom}$ 415 of its nominal value 413.

As a consequence, the falling slope 417 of the first pulse 405 and the rising slope 419 of the second gradient current pulse 407 are limited because the gradient amplifier 307 has lower input voltage and consequently the maximum value of $|U_{out}|$ is also reduced. That is, the capacitor C1+C2 is rated for a stored energy of $0.5*(C1+C2)*U_{nom}^2$ of which only $0.5*(C1+C2)*(U_{nom}^2 - x\% U_{nom}^2)$ is useful and delivered to the gradient amplifier 307. For higher values of x, which may be needed to be able to generate high slopes, the utilization of the energy storage in C1+C2 is lower. For x=80, which in practice is a minimum, only 36% of the stored energy is delivered to the gradient amplifier and load. For x=90, this is only 19%.

A fast rising slope at time 423 of the second gradient current pulse may be realized by a high input voltage $U_{in}$ at that time 423, which in turn may be realized by a large power range of the power supply and/or a large capacitance C1+C2 and/or a short duration of the first pulse. Assuming equal power range of the power supply and the same duration of the first gradient pulse, the capacitance C1+C2 needs to increase if a faster rising slope for the second gradient pulse is required. However, required capacitance C1+C2 and cost of these buffer capacitors are high for high x-values (i.e. at a low voltage drop) as described above. This is overcome by using the voltage converter 313. In fact the present method splits up C1 and C2 and makes optimum use of the energy storage of C1, because the useful energy that can be delivered to the gradient amplifier 307 can be made independent of the allowed voltage drop. The voltage converter 313 is configured to control the second voltage as to compensate for this voltage drop.

Figure 5:
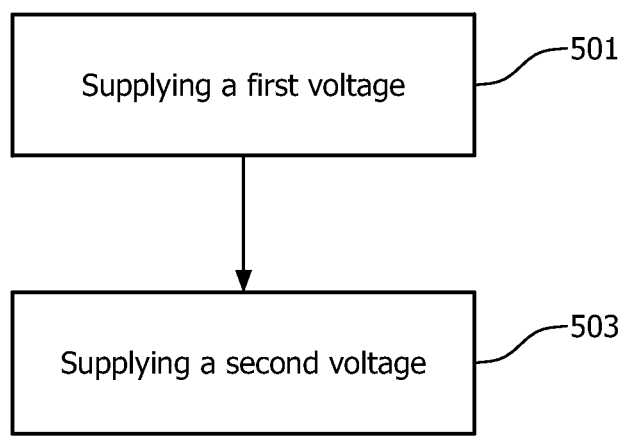
FIG. 5 shows a flowchart of a method for supplying current to a gradient coil of a magnetic resonance imaging system by a gradient amplifier system.

FIG. 5 is a flowchart for a method for supplying current to a gradient coil of a magnetic resonance imaging system by a gradient amplifier system. In step 501 an electrical power supply supplies a first voltage to a gradient amplifier for driving the gradient coil. The gradient amplifier is connected in parallel to the gradient coil. A variation in the first voltage across the gradient coil resulting from the driving of the gradient coil due for example to internal resistance of the circuit may happen. A control unit may detect the variation in the first voltage and provide feedback so as the energy buffer supplies, in step 503, a second voltage to the gradient amplifier, such that to compensate for the variation. The second voltage is controlled by a voltage converter comprised in the energy buffer.

LIST OF REFERENCE NUMERALS

100 MRI system
101 patient
103 magnetic assembly
105 magnet coil
107 gradient coil
109 gradient amplifier
111 controller
115 computer
117 input device
119 display device
121 processor
123 storage device
200 gradient amplifier
201 gradient amplifier controller
203 power chain
205 setpoint
207 gradient coil
209 controller
211 modulator
213 power stack
215 filter
217 sensor
219 capacitor
221 bridge
223-229 switches
231 line
233 output voltage
235 filtered voltage
301 power chain
303 gradient coil
305 connection
307 gradient amplifier
309 power supply
311 power supply system
313 voltage converter
501-503 steps

The invention claimed is:

1. A power chain comprising a power supply system, an energy buffer and a gradient amplifier for supplying current to a gradient coil of a magnetic resonance imaging system, the power supply system comprising:
the electrical power supply to supply a first voltage to the gradient amplifier for driving the gradient coil, the gradient amplifier output being connected to the gradient coil;
the energy buffer having an input connected to the electrical power supply, the energy buffer being configured to supply a second voltage to the gradient amplifier, the energy buffer being in parallel to the gradient amplifier and the electrical power supply, the energy buffer comprising a voltage converter configured to control the second voltage as to compensate for at least part of a variation in the first voltage resulting from the driving of the gradient coil.

2. The power chain of claim 1, wherein the energy buffer further comprises a capacitor connected at an input of the voltage converter.

3. The power chain of claim 1, further comprising a supply capacitor connected in parallel circuit with the energy buffer and the gradient amplifier, the supply capacitor being configured to supply a peak power to the gradient coil.

4. The power chain of claim 1, wherein the variation in the first voltage is due to a voltage drop across the gradient coil which exceeds a maximum deliverable power of the electrical power supply.

5. The power chain of claim 1, further comprising a control unit for detecting the variation in the first voltage and providing feedback for controlling the second voltage to the energy buffer based on the detected variation.

6. The power chain of claim 1, wherein the energy buffer is an add-on module to the electrical power supply and/or the gradient amplifier.

7. A gradient amplifier for supplying current to a gradient coil of a magnetic resonance imaging system, the gradient amplifier comprising:
an energy buffer having an input connected to an electrical power supply, the electrical power supply supplying a first voltage to the gradient amplifier for driving the gradient coil, the gradient amplifier being connected in parallel to the gradient coil, the energy buffer being configured to supply a second voltage to the gradient amplifier, the energy buffer being in parallel to the gradient amplifier and the electrical power supply, the energy buffer comprising a voltage converter configured to control the second voltage as to compensate for at least part of a variation in the first voltage resulting from the driving of the gradient coil.

8. A magnetic resonance imaging system comprising a gradient amplifier according to claim 7 and an electrical power supply or a power supply system.

9. A method for supplying current to a gradient coil of a magnetic resonance imaging system by a power supply system, the method comprising:
supplying, by an electrical power supply, a first voltage to a gradient amplifier for driving the gradient coil, wherein the gradient amplifier is connected in parallel to the gradient coil
supplying a second voltage to the gradient amplifier by an energy buffer, wherein the second voltage is controlled by a voltage converter comprised in the energy buffer as to compensate for at least part of a variation in the first voltage across the gradient coil resulting from the driving of the gradient coil, wherein the energy buffer has an input connected to the electrical power supply and is in parallel to the gradient amplifier and the electrical power supply.

10. A computer program product comprising computer executable instructions to perform the method steps of the method of claim 9.

* * * * *